(12) United States Patent
Wu et al.

(10) Patent No.: US 7,100,681 B1
(45) Date of Patent: Sep. 5, 2006

(54) HEAT DISSIPATION DEVICE HAVING HEAT PIPE

(75) Inventors: Yi-Qiang Wu, Shenzhen (CN); Wei Deng, Shenzhen (CN); Liang-Hui Zhao, Shenzhen (CN); Gen-Ping Deng, Shenzhen (CN)

(73) Assignee: Foxconn Technology Co., Ltd., (TW)

( * ) Notice: Subject to any disclaimer, the term of this patent is extended or adjusted under 35 U.S.C. 154(b) by 0 days.

(21) Appl. No.: 11/263,322

(22) Filed: Oct. 31, 2005

(51) Int. Cl.
*F28D 15/00* (2006.01)
*H05K 7/20* (2006.01)

(52) U.S. Cl. .................. 165/104.33; 165/104.21; 165/80.3

(58) Field of Classification Search ............... 165/80.3, 165/185, 104.21, 104.33; 361/698, 699, 361/700; 257/714, 715; 174/15.2, 16.3
See application file for complete search history.

(56) References Cited

U.S. PATENT DOCUMENTS

| | | | |
|---|---|---|---|
| 5,495,392 A | 2/1996 | Shen | |
| 5,677,829 A | 10/1997 | Clemens | |
| 6,189,601 B1 * | 2/2001 | Goodman et al. | 165/80.3 |
| 6,311,766 B1 | 11/2001 | Lin et al. | |
| 6,520,250 B1 | 2/2003 | Lee et al. | |
| 6,779,595 B1 * | 8/2004 | Chiang | 165/104.33 |
| 6,940,717 B1 * | 9/2005 | Shih-Tsung | 361/695 |
| 6,945,319 B1 * | 9/2005 | Li et al. | 165/104.33 |
| 6,978,829 B1 * | 12/2005 | Lin | 165/104.33 |
| 2005/0141198 A1 * | 6/2005 | Lee et al. | 361/700 |
| 2005/0257532 A1 * | 11/2005 | Ikeda et al. | 62/3.7 |
| 2006/0054307 A1 * | 3/2006 | Lee et al. | 165/80.3 |

* cited by examiner

*Primary Examiner*—Tho Duong
(74) *Attorney, Agent, or Firm*—Morris Manning & Martin LLP; Tim Tingkang Xia, Esq.

(57) ABSTRACT

A heat dissipation device includes a base, a plurality of first fins, a plate, a plurality of second fins and two heat pipes. Each heat pipe includes a heat-receiving portion sandwiched between the base and the first fins, a heat-exchange portion sandwiched between the plate and the first fins, a connecting portion connecting the heat-receiving portion and the heat-exchange portion, a heat-discharging portion extending through the plate and inserted into the second fins. At least one of the heat pipes defines two different planes which intercross at the heat-exchange portion of the at least one of the heat pipes.

19 Claims, 3 Drawing Sheets

HEAT DISSIPATION DEVICE HAVING HEAT PIPE

BACKGROUND

1. Field

The present invention relates generally to a heat dissipation device, and more particularly to a heat dissipation device for cooling a heat-generating electronic device, having uniquely configured heat pipes to enhance heat dissipation capability thereof.

2. Description of Related Art

It is widely acknowledged that heat is produced during operation of electronic devices such as central processing units (CPUs). The heat produced must be quickly removed to ensure the CPUs to work normally. Typically, a heat sink is provided to remove heat from the CPU. More and more electronic components are integrated on the CPU, which makes the CPU hotter and hotter during operation. The conventional heat sink, which is made of a simple slotted metal block attached on the CPU, is no longer a satisfactory means for dissipating heat from the CPU.

Phase change equipments, such as heat pipes are developed to assist heat management of the heat-generating electronic device. Generally, a heat dissipation device with heat pipe comprises a base to absorb heat from the electronic device, a plurality of fins extending from the base and two heat pipes. Each heat pipe comprises an evaporator engaging with the base and a condenser engaging with the fins. During operation of the heat dissipation device, the base absorbs the heat from the electronic device. One part of the heat is directly transferred to bottom portions of the fins. The other part of the heat is transferred to top portions of the fins via the heat pipes.

However, the conventional heat dissipation device with heat pipe has the following disadvantage. First, the heat pipes cannot optimally utilized either when they are extended parallel to each other or when they are extended in a nonparallel manner. For the former, two neighboring evaporators of the heat pipes are separated from each other a distance equal to that between two neighboring condensers of the heat pipes. The evaporators of the heat pipes may be separated from each other a distance which is too far from each other to enable the evaporators to sufficiently absorb the heat of the heat-generating electronic device, which is mainly accumulated at a central portion of the base. On the other hand, the condensers of the heat pipes may be separated from each other a distance which is too close to enable the condensers to evenly distribute the heat transferred from the evaporators to the top portions of the fins. For the latter, although the above problem can be resolved, a width of the fins must be increased significantly in order to accommodate the condensers of the heat pipes. The increase of the width of the fins is quite disadvantageous in view of a compact design of the heat dissipation device for transportation, storage and installation. Summarily, the conventional heat dissipation device with heat pipes cannot simultaneously meet the requirements that the evaporators focus at the central portion of the base of the heat dissipation device to efficiently remove the heat from the base, and that the condensers can evenly distribute the heat to the fins without increasing the width of the fins.

SUMMARY

Accordingly, what is needed is a heat dissipation device accompanying phase change, which is able to efficiently remove heat from a heat generating device and simultaneously evenly distribute the heat to fins of the heat dissipation device without increasing a width of the fins.

A heat dissipation device in accordance with a preferred embodiment of the present invention comprises a base, a plurality of first fins, a plate, a plurality of second fins and two heat pipes. Each heat pipe comprises a heat-receiving portion sandwiched between the base and a bottom of the first fins, a heat-exchange portion sandwiched between the plate and a top of the first fins, a connecting portion connecting the heat-receiving portion and the heat-exchange portion, a heat-discharging portion extending through the plate and inserted into the second fins. At least one of the heat pipes defines two different planes which intercross at the heat-exchange portion of the at least one of the heat pipes. A part of heat received from a heat-generating electronic device by the base is transferred to the first fins through a direct contact between the first fins and base, and the other part is transferred to the first fins and second fins through the connections between the heat pipes and the first fins and the second fins.

Other advantages and novel features of the present invention will become more apparent from the following detailed description when taken in conjunction with the accompanying drawings, in which:

DETAILED DESCRIPTION OF THE EMBODIMENT

Figure 1:
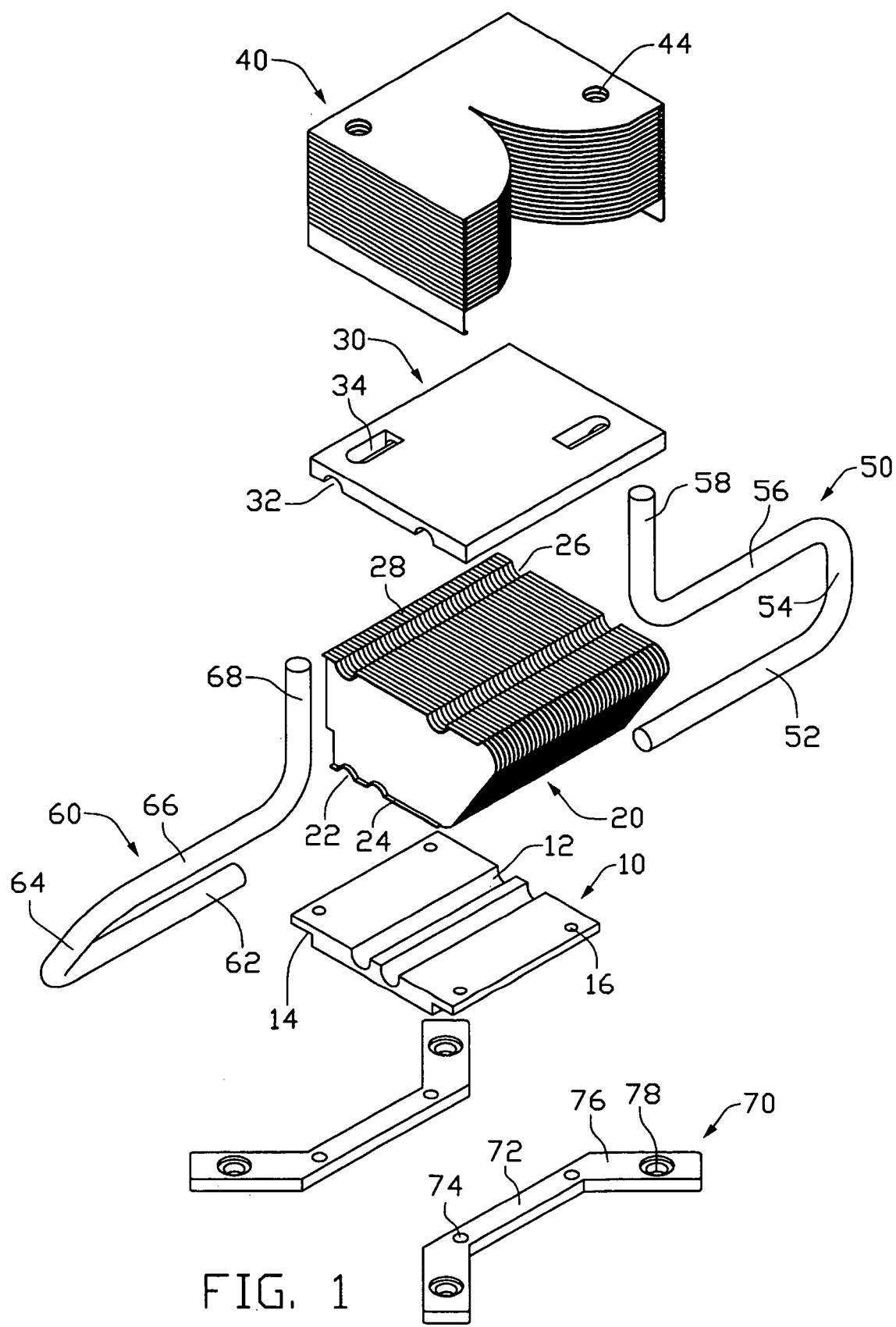
FIG. 1 is an exploded, isometric view of a heat dissipation device according to a preferred embodiment of the present invention.

Reference will now be made to the drawing figures to describe the present invention in detail.

Referring to FIG. 1, a heat dissipation device of the preferred embodiment of the present invention is used for mounting to a printed circuit board (not shown) to remove heat from a heat-generating electronic device (not shown) mounted to the printed circuit board, such as a CPU. The heat dissipation device comprises a base 10, a plurality of vertical fins 20 attached to the base 10, a plate 30 on the vertical fins 20, a plurality of horizontal fins 40 on the plate 30 and first and second heat pipes 50, 60. The heat dissipation device further comprises two locking members 70 engaging with the base 10 to secure the heat dissipation device to the printed circuit board.

The base 10 is a metal plate having a high heat conductivity, and has a rectangular configuration. The base 10 comprises a bottom surface (not labeled) for contacting with the electronic device and a top surface (not labeled) opposite the bottom surface. The base 10 defines two parallel grooves 12 in the top surface thereof, for receiving the heat pipes 50, 60. The two grooves 12 are closely spaced, and located at a center of the base 10. The base 10 defines two undercuts (not labeled) in opposite sides of the bottom surface thereof to form two locking portions 14 for fastening with the locking members 70. The undercuts are parallel to the grooves 12. Each locking portion 14 defines two locking holes 16 therein.

Each vertical fin 20 is made of a metal sheet, and has a trapeziform configuration. Each vertical fin 20 defines two slots 22 at a bottom thereof and forms a flange 24 perpendicularly extending from a bottom edge thereof. Each fin 20 defines two slots 26 at a top thereof and forms a flange 28 perpendicularly extending from a top edge thereof. The slots 22 are located correspondent to the grooves 12 when the vertical fins 20 are soldered to the top surface of the base 10. The slots 26 are adjacent to two opposite ends of the top of the vertical fin 20. The flanges 24 and the flanges 28 render the vertical fins 20 in uniform intervals.

The plate 30 is a metal plate having high heat conductivity, and has a rectangular configuration. The plate 30 is mounted on the top of the vertical fins 20 to be parallel to the base 10. The plate 30 defines two flutes 32 at a bottom thereof corresponding to the slots 26 of the vertical fins 20. Two elongated openings 34 are defined vertically through the plate 30 and adjacent to two diagonal corners of the plate 30. The openings 34 communicate with the flutes 32, respectively.

Each horizontal fin 40 is parallel to the plate 30 and defines two holes 44 in alignment with the openings 34 of the plate 30 respectively. The horizontal fins 40 are horizontally stacked on each other to form a horizontal fin group. The holes 44 cooperatively define two holes vertically extending through the horizontal fin group.

Figure 4:
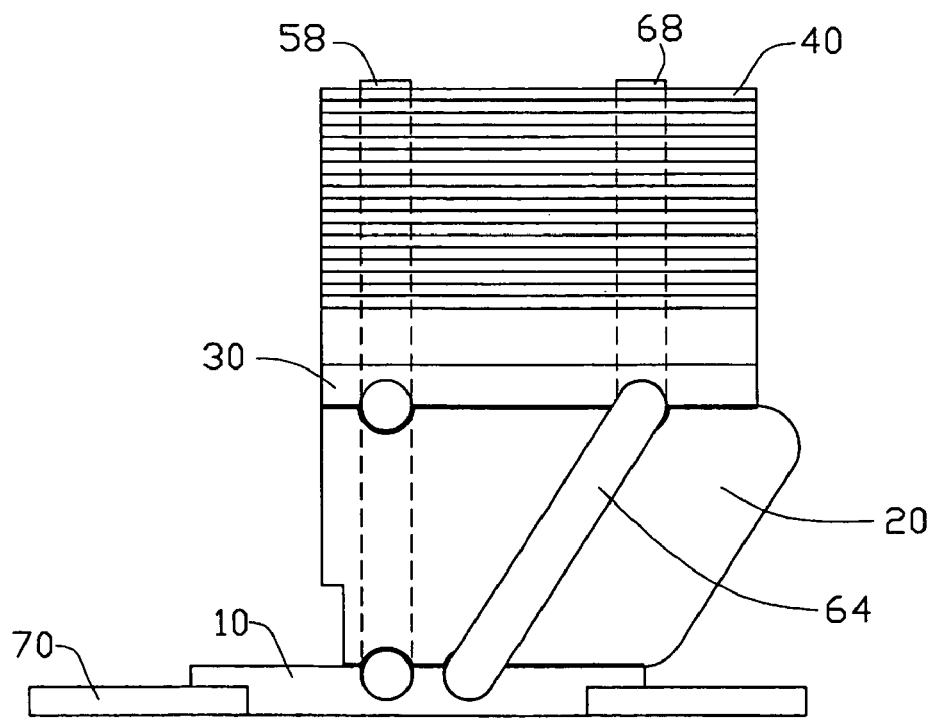
FIG. 4 is a side elevation view of FIG. 3.

The first heat pipe 50 comprises a horizontal heat-receiving portion (evaporator) 52, a connecting portion 54 extending perpendicularly and vertically upwardly from the heat-receiving portion 52, a heat-exchange portion 56 extending perpendicularly and horizontally form the connecting portion 54 and parallel to the heat-receiving portion 52, and a heat-discharging portion 58. The heat-exchange portion 56 and the heat-discharging portion 58 cooperatively form a condenser for the first heat pipe 50. The heat-discharging portion 58 is extended perpendicularly and vertically upwardly from the heat-exchange portion 56 and parallel to the connecting portion 54. The heat-receiving portion 52, the connecting portion 54, the heat-exchange portion 56 and the heat-discharging portion 58 of the first heat pipe 50 extend in a common plane (clearly seen in FIG. 4).

The second heat pipe 60 comprises a horizontal heat-receiving portion 62, a connecting portion 64 extending slantwise upwardly from the heat-receiving portion 62, a heat-exchange portion 66 extending perpendicularly from the connecting portion 64 and parallel to the heat-receiving portion 62, and a heat-discharging portion 68. The heat-discharging portion 68 is extended perpendicularly and vertically upwardly from the heat-exchange portion 66, whereby the heat-discharging portion is oriented with an angle relative to the connecting portion 64. The heat-receiving portion 62 constitutes an evaporator for the second pipe 60, and the heat-exchange portion 66 and the heat-discharging portion 68 constitute a condenser for the second heat pipe 60. The heat-receiving portion 62, the connecting portion 64, the heat-exchange portion 66 define a first plane. The heat-exchange portion 66 and the heat-discharging portion 68 define a second plane intercrossing with the first plane at the heat-exchange portion 66 (clearly seen in FIG. 4).

Each locking member 70 comprises a locking lever 72 engaging with the corresponding locking portion 14 of the base 10 and two legs 74 extending outwardly from opposite ends of the locking lever 72 and angled with the locking lever 72. The locking lever 72 defines bores 74 therein. Screws or rivets (not shown) are used to extend through the locking holes 16 and engage in the bores 74 to secure the locking members 70 to the base 10. The legs 74 define apertures 78 therein for extending screws or rivets (not shown) therethrough to engage in corresponding fixtures (not shown) on the printed circuit board to thereby mount the heat dissipation device to the printed circuit board.

Figure 2:
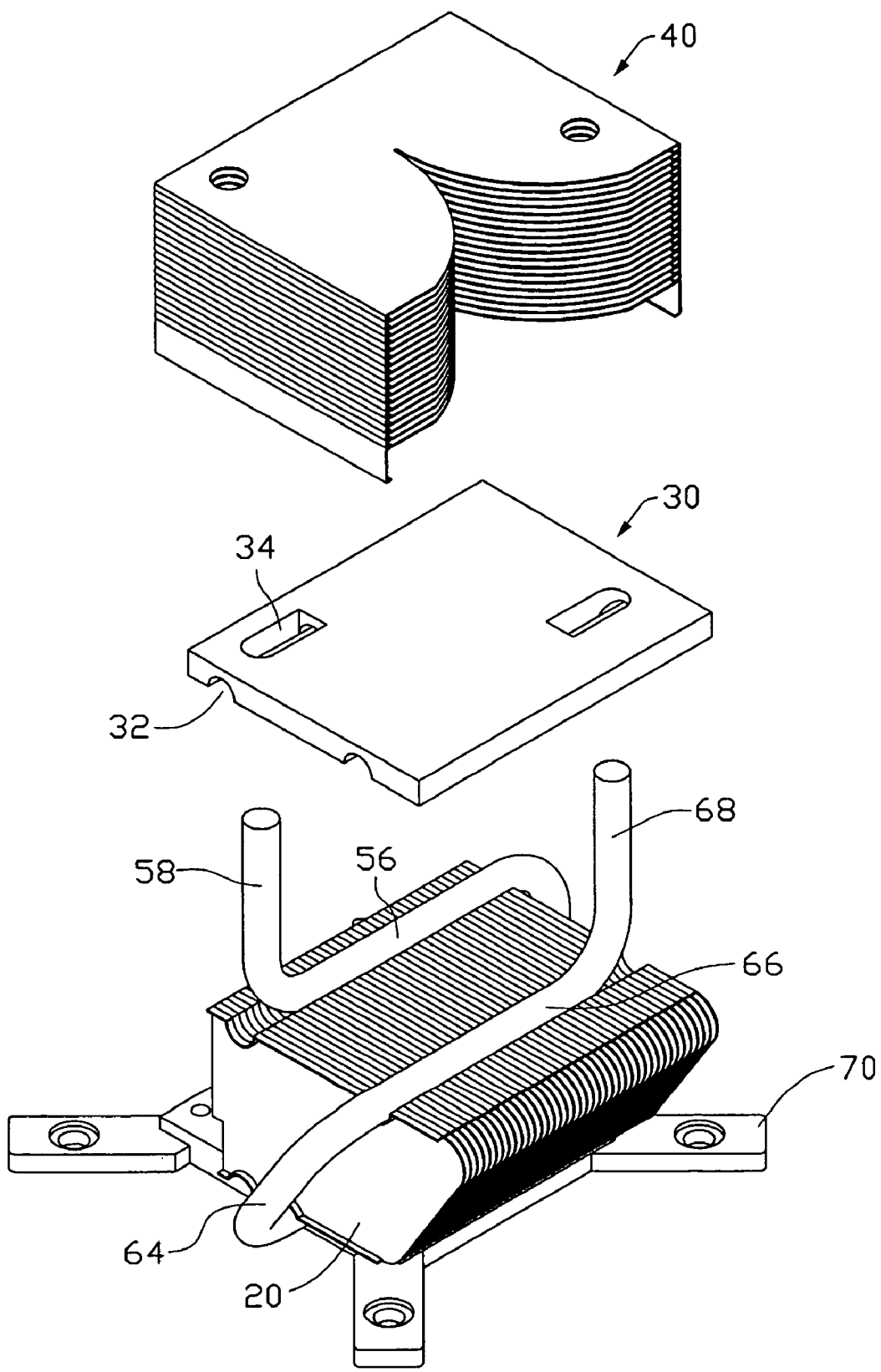
FIG. 2 is a pre-assembly view of FIG. 1.
Figure 3:
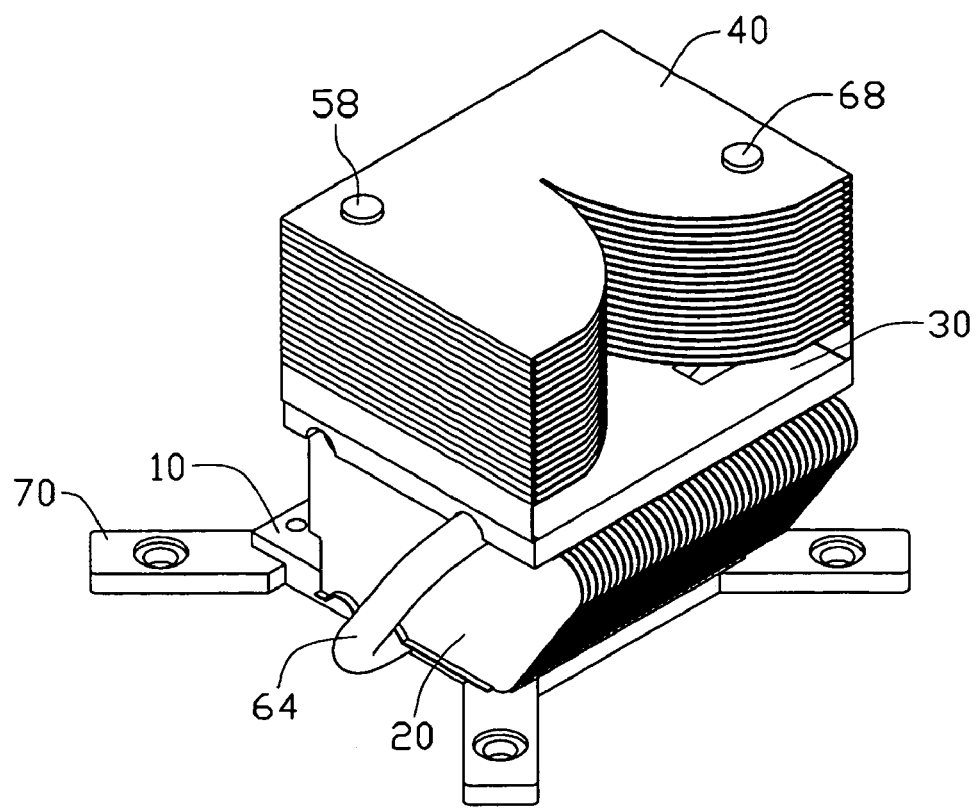
FIG. 3 is an assembled view of FIG. 1.

Referring also to FIGS. 2–3, in assembly of the heat dissipation device, the heat-receiving portions 52, 62 are soldered in channels (not labeled) defined by the grooves 12 of the base 10 and the slots 22 of the vertical fins 20, wherein the heat-receiving portions 52, 62 are extended into the channels from opposite sides of the base 10/vertical fins 20 combination, respectively. The bottom of the vertical fins 20 is soldered to the top surface of the base 10 and thermally contacts with the base 10 and the heat-receiving portions 52, 62 of the first and second heat pipes 50, 60. The connecting portions 54, 64 are disposed at opposite sides of the fins 20, respectively. The heat-exchange portions 56, 66 extend into channels (not labeled) defined by the flutes 32 of the plate 30 and the slots 26 of the fins 20, from opposite sides of the vertical fins 20 respectively, and are soldered therein and thermally contact the plate 30 and the top of the vertical fins 20. The plate 30 is soldered to the top of the vertical fins 20. The heat-discharging portions 58, 68 extend through the openings 34 of the plate 30 and extend into the holes 44 of the horizontal fins 40. The horizontal fins 40 are soldered to a top of the plate 30. The flanges 24, 28 of the fins 20 thermally contact the top surface of the base 10 and a bottom surface of the plate 30 to directly exchange heat with the base 10 and the plate 30.

Referring to FIGS. 1–4, the heat-receiving portions 52, 62 are adjacent the centre of the base 10. The connecting portions 54, 64 commonly have a V-shaped projection on the fins 20. The heat-exchange portions 56, 66 are located adjacent two opposite ends of the top of the fins 20. The heat-discharging portions 58, 68 extend in two parallel lines through the openings 34 and the holes 44 at opposite diagonal corners of the horizontal fins 40. As a result, the heat-receiving portions 52, 62 of the heat pipes 50, 60 focus on the centre of the base 10 to absorb heat accumulated on the centre of the base 10. A part of the heat absorbed by the base 10 is received by the heat-receiving portions 52, 62 of the heat pipes 50, 60 and transferred to the top of the vertical fins 20 and the plate 30 via the heat-exchange portions 56, 66 of the heat pipes 50, 60, and distributed to top portions of the fins vertical 20. Bottom portions of the vertical fins 20 directly receive the other part of the heat from the base 10. The part of the heat received by the heat pipes 50, 60 from the base 10 is further transferred from the heat-exchange portions 56, 66 to the heat to the heat-discharging portions 58, 68. From the heat-discharging portions 58, 68, the part of the heat is transferred to and distributed over the horizontal fins 40 via a thermal contact between the heat-discharging portions 58, 68 and the horizontal fins 40. By the present invention design, the evaporators 52, 62 of the heat pipes 50, 60 can be located to the heat-intensive area of the base 10, and the condensers 56, 66, 58, 68 can sufficiently contact with the heat dissipating fins 20, 40, without increasing width of the heat dissipation device. The present invention provides a compact heat dissipation device which can efficiently remove heat from an up-to-date heat-generating electronic device.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipation device comprising:
a base;
a plurality of first fins attached to the base;
a plate;
a plurality of second fins attached to the plate;
two heat pipes, each of the two heat pipes comprising a heat-receiving portion sandwiched between the base and the first fins, a heat-exchange portion sandwiched between the plate and the first fins, a connecting portion connecting the heat-receiving portion and the heat-exchange portion, a heat-discharging portion extending trough the plate and inserted into the second fins;
wherein at least one of the heat pipes defines two different planes which intercross at the heat-exchange portion of the at least one of the heat pipes.

2. The heat dissipation device of claim 1, wherein the heat-receiving portion, the connecting portion and the heat-exchange portion of the at least one of the heat pipes commonly define a first plane, and wherein the heat-exchange portion and the heat-discharging portion of the at least one of the heat pipes commonly define a second plane which intercross the first plane at the heat-exchange portion of the at least one of the heat pipes.

3. The heat dissipation device of claim 1, wherein the base defines parallel grooves therein and the first fins define slots at a bottom thereof, the grooves and the slots commonly define channels to receive the heat-receiving portions of the heat pipes.

4. The heat dissipation device of claim 3, wherein the grooves are adjacent a centre of the base.

5. The heat dissipation device of claim 1, wherein the plate defines parallel flutes therein and the first fins define slots at a top thereof, the flutes and the slots commonly define channels to receive the heat-exchange portions of the heat pipes.

6. The heat dissipation device of claim 5, wherein the slots are adjacent two opposite ends of the top of the first fins.

7. The heat dissipation device of claim 1, wherein the plate defines two elongated openings at two opposite diagonal corners thereof through which the heat-discharging portions of the heat pipes extend, respectively.

8. The heat dissipation device of claim 7, wherein the second fins define through holes therein corresponding to the openings, the heat-discharging portions of the heat pipes being inserted into the trough holes, respectively.

9. The heat dissipation device of claim 1, wherein the second fins are parallel to the plate.

10. The heat dissipation device of claim 1, wherein the heat-discharging portions are perpendicular to the second fins and wherein the heat-receiving portions are parallel to the heat-exchange portions.

11. The heat dissipation device of claim 1, wherein the connecting portions of the heat pipes are disposed at two opposite sides of the first fins.

12. A heat dissipation device comprising:
a base;
a plurality of first fins attached to the base;
a plate;
a plurality of second fins;
two heat pipes, each of the two heat pipes comprising a heat-receiving portion sandwiched between the base and the first fins, a heat-exchange portion sandwiched between the plate and the first fins, a connecting portion connecting the heat-receiving portion and the heat-exchange portion, a heat-discharging portion extending through the plate and inserted into the second fins;
wherein the heat-receiving portions are located adjacent a centre of the base, the connecting portions commonly have a V-shaped projection on the fins, the heat-exchange portions are located adjacent two opposite ends of a top of the first fins and the heat-discharging portions extend as two parallel lines.

13. The heat dissipation device of claim 12, wherein the connecting portions of the heat pipes are disposed at two opposite sides of the first fins.

14. The heat dissipation device of claim 12, wherein the base is parallels to the plate and is parallel the second fins.

15. The heat dissipation device of claim 12, wherein the plate defines two elongated openings at two opposite diagonal corners thereof, heat-discharging portions of the heat pipes extending through the two elongated openings, respectively.

16. The heat dissipation device of claim 15, wherein the second fins define through holes therein corresponding to the openings, the heat-discharging portions of the heat pipes being inserted into the through holes, respectively.

17. A heat dissipation device comprising:
a first fin group having fins oriented at a first direction;
a second fin group located above the first fin group and having fins oriented at a second direction different from the first direction;
first and second heat pipes each having a evaporator thermally engaging with a bottom of the first fin group, a first condenser engaging with a top of the first fin group and a second condenser engaging with the second fin group; and
a rectangular metal plate located between the first fin group and the second fin group, and the second condensers extending through the plate at two opposite diagonal corners of the plate, respectively.

18. The heat dissipation device of claim 17, wherein the first and second heat pipes each comprise a connecting portion interconnecting a corresponding evaporator with a corresponding first condenser, the connecting portions cooperatively forming a substantially V-shaped configuration.

19. The heat dissipation device of claim 17, wherein the fins of the first fin group are vertically oriented and the fins of the second fin group are horizontally oriented.

* * * * *